United States Patent
Braun

(10) Patent No.: US 10,930,644 B2
(45) Date of Patent: *Feb. 23, 2021

(54) BI-DIRECTIONAL SNAPBACK ESD PROTECTION CIRCUIT

(71) Applicant: Monolithic Power Systems, Inc., San Jose, CA (US)

(72) Inventor: Eric Braun, Mountain View, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 173 days.

This patent is subject to a terminal disclaimer.

(21) Appl. No.: 16/195,681

(22) Filed: Nov. 19, 2018

(65) Prior Publication Data

US 2019/0088641 A1 Mar. 21, 2019

Related U.S. Application Data

(63) Continuation-in-part of application No. 15/062,019, filed on Mar. 4, 2016, now Pat. No. 10,263,420.

(51) Int. Cl.
| | |
|---|---|
| *H01L 29/10* | (2006.01) |
| *H01L 27/02* | (2006.01) |
| *H01L 27/088* | (2006.01) |
| *H02H 9/04* | (2006.01) |
| *H01L 29/861* | (2006.01) |

(52) U.S. Cl.
CPC ........ *H01L 27/0277* (2013.01); *H01L 27/088* (2013.01); *H01L 29/1095* (2013.01); *H02H 9/046* (2013.01); *H01L 29/861* (2013.01)

(58) Field of Classification Search
CPC ............. H01L 27/0207; H01L 27/0277; H01L 27/088; H01L 29/1095; H01L 29/861; H02H 9/046

See application file for complete search history.

(56) References Cited

U.S. PATENT DOCUMENTS

| | | | |
|---|---|---|---|
| 5,675,522 | A | 4/1997 | Watt |
| 6,351,364 | B1 | 2/2002 | Chen et al. |
| 8,907,373 | B2 | 12/2014 | Galy et al. |
| 2003/0011949 | A1 | 1/2003 | Ker et al. |
| 2003/0133237 | A1* | 7/2003 | Hung .................. H01L 27/0266 361/56 |
| 2011/0026175 | A1 | 2/2011 | Ker et al. |

(Continued)

OTHER PUBLICATIONS

U.S. Appl. No. 14/971,920, filed Dec. 16, 2015, Monolithic Power Systems, Inc.

(Continued)

*Primary Examiner* — Kyle J Moody
*Assistant Examiner* — Jye-June Lee
(74) *Attorney, Agent, or Firm* — Perkins Coie LLP

(57) ABSTRACT

An ESD protection circuit having a discharging transistor and a body snatching circuit. The discharging transistor is electrically coupled between a first node and a second node. The gate of the discharging transistor is electrically coupled to a driving voltage. The body snatching circuit receives the voltages at the first and second nodes and outputs either the voltage at the first node or the voltage at the second node based on which of these two voltages have a lower value. The output voltage of the body snatching circuit is provided to the body of the discharging transistor.

16 Claims, 7 Drawing Sheets

(56) References Cited

U.S. PATENT DOCUMENTS

| | | | | |
|---|---|---|---|---|
| 2014/0204488 A1* | 7/2014 | Worley | ................. | H02H 9/046 |
| | | | | 361/56 |
| 2015/0180469 A1* | 6/2015 | Kim | .................... | H03K 17/687 |
| | | | | 327/537 |
| 2015/0187752 A1* | 7/2015 | Salman | .............. | H01L 29/1008 |
| | | | | 257/526 |
| 2017/0256940 A1 | 9/2017 | Braun | | |

OTHER PUBLICATIONS

H. Sarbishaei, "Electrostatic Discharge Protection Circuit for High-Speed Mixed-Signal Circuits," pp. 17-20, PHD thesis to Waterloo. 2007, 141 pages.

\* cited by examiner

US 10,930,644 B2

BI-DIRECTIONAL SNAPBACK ESD PROTECTION CIRCUIT

This application is a continuation-in-part of U.S. patent application Ser. No. 15/062,019, filed on Mar. 4, 2016, which is hereby incorporated by reference.

FIELD OF THE INVENTION

The present invention relates generally to integrated circuits, and more particularly but not exclusively to ESD (electrostatic discharge) protection circuits for protecting the integrated circuits.

BACKGROUND OF THE INVENTION

Integrated circuits (ICs) may be damaged from electrostatic discharge (ESD) when a source of electrostatic potential (e.g., human body) comes to contact with the integrated circuits, as an ESD spike may show up, with a voltage reaching up to several thousand volts within a very short time period, typically within 10-100 ns.

An ESD protection circuit is often placed between a first node and a second node to protect an integrated circuit coupled therebetween against an ESD event. Conventional Grounded Gate NMOS (GGNMOS) architecture is a frequent choice for an ESD protection circuit. In such architecture, the drain of an NMOS transistor is coupled to the first node, while the source and gate of the NMOS transistor are coupled to the second node. Additionally coupled to the second node is the body of the NMOS transistor. When an ESD spike shows up at the first node, the parasitic bipolar transistor formed by the drain, the body and the source of the NMOS transistor is turned on and conducts current from the first node to the second node to discharge ESD energy, due to the reverse junction breakdown and secondary breakdown of the parasitic bipolar transistor, which is observed as a snapback behavior. See, for example, H. Sarbishaei, Electrostatic Discharge Protection Circuit for High-Speed Mixed-Signal Circuits, pp. 17-20, (PHD thesis to Waterloo), which is incorporated herein by reference.

However, one drawback with such GGNMOS configuration is that when a noise is coupled to the second node, with a voltage value which makes the difference between the noise voltage and the voltage at the first node higher than the forward on-threshold voltage of the drain-body junction of the parasitic bipolar transistor, such drain-body junction is forward biased and is turned on. And consequently, the drain voltage, i.e., the voltage at the first node which is supplied to the integrated circuit follows the noise voltage, introducing the possibility of disturbing the integrated circuit through noise sensitivity of any circuitry connected to the second node.

Thus, there is a need for addressing these and/or other issues associated with this conventional GGNMOS ESD protection circuit.

SUMMARY

Embodiments of the present invention are directed to an ESD protection circuit. The ESD protection circuit is coupled between a first node and a second node. At the first node exits a first voltage, and at the second node exits a second voltage. The ESD protection circuit has a discharging transistor and a body snatching circuit. The discharging transistor has a drain, a gate, a source and a body. The drain is coupled to the first node, the source is coupled to the second node, and the gate is coupled to a driving voltage. The body snatching circuit has a first input terminal, a second input terminal and an output terminal. The first input terminal is coupled to the first node, the second input terminal is coupled to the second node, and the output terminal is coupled to the body. The body snatching circuit is configured to output the lower one of the first voltage and the second voltage at the output terminal.

Embodiments of the present invention are further directed to a circuitry. The circuitry has an ESD protection circuit and an integrated circuit. The ESD protection circuit is coupled between a first node and a second node. At the first node exits a first voltage, and at the second node exits a second voltage. The ESD protection circuit has a discharging transistor and a body snatching circuit. The discharging transistor has a drain, a gate, a source and a body. The drain is coupled to the first node, the source is coupled to the second node, and the gate is coupled to a driving voltage. The body snatching circuit has a first input terminal, a second input terminal and an output terminal. The first input terminal is coupled to the first node, the second input terminal is coupled to the second node, and the output terminal is coupled to the body. The body snatching circuit is configured to output the lower one of the first voltage and the second voltage at the output terminal. The integrated circuit is coupled between the first node and the second node.

Embodiments of the present invention are further directed to a semiconductor structure for protecting an integrated circuit coupled between a first node and a second node from ESD damage. The semiconductor structure has a semiconductor layer having a first conductivity type and a top surface. The semiconductor structure has a first well, a second well, a third well and a fourth well. The first, second, third and fourth wells have a second conductivity type opposite to the first conductivity type. The first, second, third and fourth wells are located in the semiconductor layer adjoining the top surface and are isolated with each other by the semiconductor layer. The first, second, third and fourth wells are arranged in sequence with respect to the lateral direction of the semiconductor layer. The semiconductor structure also has a first gate, a second gate and a third gate. The first, second and third gates are located insulatively above the top surface of the semiconductor layer. The first gate overlaps laterally with a portion of both the first and second wells, the second gate overlaps laterally with a portion of both the second and third wells, and the third gate overlaps laterally with a portion of both the third and fourth wells. The second well and the third gate are coupled to the first node, the second gate and the first and fourth wells are coupled to the second node, and the first gate, the third well and the semiconductor layer are electrically coupled together.

DESCRIPTION OF THE DRAWINGS

The present invention can be further understood with reference to the following detailed description and the appended drawings, wherein like elements are provided with like reference numerals.

DESCRIPTION

Figure 1:
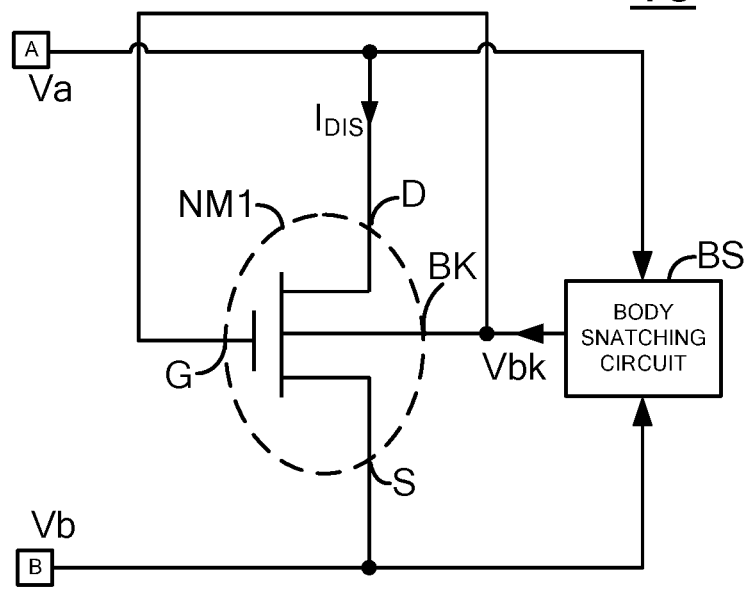
FIG. 1 illustrates an ESD protection circuit 10 in accordance with an embodiment of the present invention.

The present invention is now described. While it is disclosed in its preferred form, the specific embodiments of the invention as disclosed herein and illustrated in the drawings are not to be considered in a limiting sense. Rather, these embodiments are provided so that this invention will be thorough and complete, and will fully convey the scope of the invention to those skilled in the art. Indeed, it should be readily apparent in view of the present description that the invention may be modified in numerous ways. Among other things, the present invention may be embodied as devices, methods, and so on. The following detailed description is, therefore, not to be taken in a limiting sense.

Throughout the specification, the meaning of "a," "an," and "the" may also include plural references.

As can be appreciated, the conductivity and doping of materials or regions disclosed herein may be varied, with appropriate changes to the conductivity and doping of other materials or regions, depending on the application.

FIG. 1 illustrates an ESD protection circuit 10 in accordance with an embodiment of the present invention. Refer to FIG. 1, the ESD protection circuit 10 is coupled between node A and node B for protecting an integrated circuit (not shown) which is also coupled between node A and node B from damage when an ESD event occurs. For ease of description, the voltages at node A and at node B are respectively denoted as voltage Va and voltage Vb hereinafter. In the embodiment of FIG. 1, node A is illustrated as an input pad configured to provide an input voltage to the integrated circuit, while node B is illustrated as a ground pad. However, it should be noted that this is not intended to limit the scope of the invention, in another embodiment, node A and node B may be any combination of any suitable pad type, such as I/O pad for inputting signals to or outputting signals from the integrated circuit, supply pad for supplying operating voltages to the internal components of the integrated circuit, ground pad or the like, where an ESD event may occur and noise coupling is a concern. For example, node A and node B may be respectively an I/O pad and a ground pad for ESD protection circuits comprising N-type transistors, an I/O pad and a supply pad for ESD protection circuits comprising P-type transistors, or a supply pad and a ground pad for ESD protection circuits comprising either N-type or P-type transistors.

With continuing reference to FIG. 1, the ESD protection circuit 10 is illustrated to comprise a discharging transistor NM1 and a body snatching circuit BS. In the illustrated embodiment, the discharging transistor NM1 comprises an N-type Metal-Oxide-Semiconductor (NMOS) transistor having a first terminal, a second terminal, a gate G and a body BK, wherein the first terminal is coupled to node A, the second terminal is coupled to node B, and the gate G is coupled to the body BK. Further, in the illustrated embodiment, the first terminal comprises a drain D, the second terminal comprises a source S. Persons of ordinary skill in the art will recognize that other embodiments may be contemplated with any other suitable transistor type which has at least 3 terminals with the gate terminal tied to one of the other two terminals and is able to constitute an off-state condition. Persons of ordinary skill in the art will also recognize that other embodiments may be contemplated with a P-type conductivity device. For example, an NPN or PNP bipolar transistor, or a PMOS transistor, etc. is applicable to the present invention.

In the context of the present description, the term "couple" may refer to "directly connect" without intervention of any other element, or "indirectly connect", e.g., by way of a resistor, or even possibly "electrically connect" which means the associated elements are at the same voltage level, see, for example, in the description of the semiconductor structure illustrated later in FIG. 5 and FIG. 6.

The body snatching circuit BS is illustrated to have a first input terminal, a second input terminal and an output terminal, wherein the first input terminal is coupled to node A to receive the voltage Va, the second input terminal is coupled to node B to receive the voltage Vb, and the output terminal is coupled to the body BK of the discharging transistor NM1. The body snatching circuit BS is configured to provide a body bias voltage Vbk at the output terminal, based on the voltages Va and Vb. Specifically, the body snatching circuit BS is configured to output either the voltage Va or the voltage Vb based on which of the voltages Va and Vb has a smaller value. In other words, the body snatching circuit BS is configured to output the voltage Va when the voltage Va is lower than the voltage Vb, and to output the voltage Vb when the voltage Vb is lower than the voltage Va.

Figure 2:
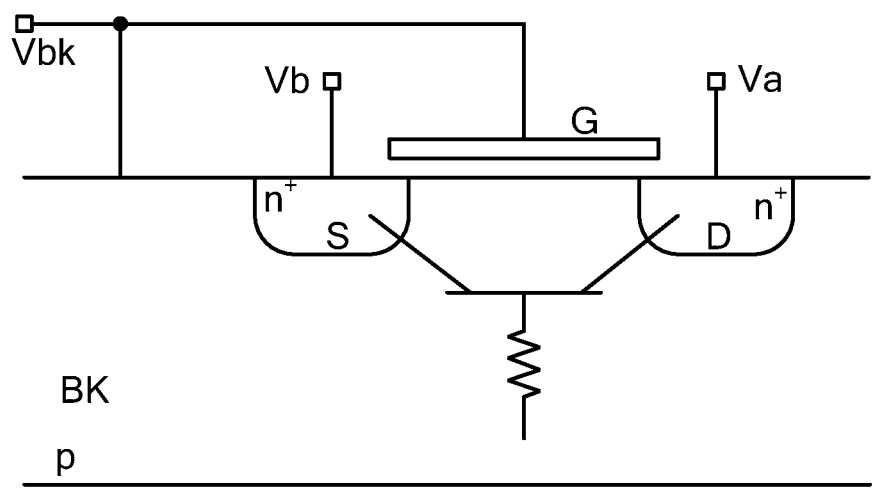
FIG. 2 illustrates a semiconductor structure 20 of the NMOS transistor NM1 of FIG. 1 for showing the operation of the ESD protection circuit 10.

FIG. 2 illustrates a semiconductor structure 20 of the NMOS transistor NM1 of FIG. 1 for showing the operation of the ESD protection circuit 10. As shown in FIG. 2, inside a P-type body BK, two highly-doped N wells operate respectively as the drain D coupled to the voltage Va, and the source S coupled to the voltage Vb. The gate G and the body BK of the NMOS transistor NM1 are coupled to the body bias voltage Vbk, as shown in FIG. 2. Continue referring to FIG. 2, inside the NMOS transistor NM1, a parasitic bipolar transistor is formed by the drain D, the body BK and the source S. In particular, the body BK serves as the base of the parasitic bipolar transistor, and a drain-body junction is formed between the body BK and the drain D, and a source-body junction is formed between the body BK and the source S.

Figure 3:
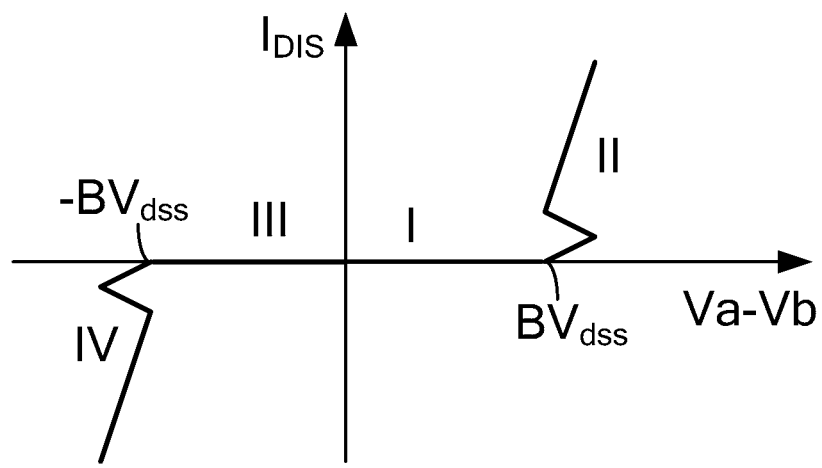
FIG. 3 illustratively shows a current IDIS flowing through the discharging transistor NM1 over the difference between the voltages Va and Vb (Va−Vb)

FIG. 3 illustratively shows a current IDIS flowing through the discharging transistor NM1 over the difference between the voltages Va and Vb (Va-Vb). The overall operation of the ESD protection circuit 10 will now be set forth with references to FIG. 1 FIG. 3. It should be noted that, the following description is set forth assuming that node A is an input pad while node B is a ground pad, but, of course, such operation may apply to the ESD protection circuit 10 with any other type of pads.

During normal operation, the voltage Va at node A is the input voltage provided to the integrated circuit, e.g., 5 volts, and the voltage Vb at node B is a ground reference voltage with a typical value of zero volts. Under such conditions, the body snatching circuit BS outputs the voltage Vb as the body bias voltage Vbk to the body BK of the discharging transistor NM1, which in turn sets the difference (5 volts) between the voltages respectively applied to the drain D and the body BK higher than zero volts but lower than the breakdown voltage BVdss of the drain-body junction, e.g., 10 volts for 5V operation NMOS. That is, 0<(Va−Vb) <BVdss. Thus, the drain-body junction is reversely biased and is in an off state. Consequently, the ESD protection circuit 10 conducts no current. That is, the current IDIS flowing through the discharging transistor NM1 is zero Amps, as Phase I of FIG. 3 shows. As a result, the integrated circuit protected by the ESD protection circuit 10 operates normally with the input voltage.

During an ESD event, the voltage Va at node A goes up rapidly to a high value, e.g., 12 volts for 5V operation NMOS, while the voltage Vb at node B remains at the 0V ground reference voltage. Under such conditions, the body snatching circuit BS outputs the voltage Vb to the body BK of the discharging transistor NM1, which in turn sets the difference (12 volts) between the voltages respectively applied to the drain D and the body BK higher than the 10V breakdown voltage BVdss of the drain-body junction (BVdss<(Va−Vb)). Thus, the drain-body junction goes into a first breakdown and a second breakdown sequentially, which is observed as a snapback behavior as phase II of FIG. 3 shows. At this point, current flows from the drain D to the body BK, resulting an increase of the base voltage of the parasitic bipolar transistor and a subsequent body-source current by turning on the body-source junction. As phase II in FIG. 3 shows, the current IDIS flows from node A to node B through the discharging transistor NM1, to discharge the ESD energy. As a result, ESD protection is provided to protect the integrated circuit from damage.

When a noise, for example, with a voltage value above 10 volts for 5V operation NMOS with 10V BVdss, is coupled to node B, causing the voltage Vb at node B higher than the 5V voltage Va at node A, the body snatching circuit BS outputs the voltage Va as the body bias voltage Vbk which is provided to the body BK of the NMOS transistor NM1. Thus, on one hand, upon the voltage Vb applied to the source S being higher than the voltage Va applied to the body BK, the source-body junction is reversely biased. And on the other hand, the drain-body junction is not biased as both the drain D and the body BK are applied with the same voltage Va.

In phase III as shown in FIG. 3, when the voltage difference (Vb-Va) is lower than the breakdown voltage BVdss of the source-body junction, the source-body junction is in an off state. Consequently, no current flows through the parasitic bipolar transistor of the discharging transistor NM1. That is, the current IDIS flowing through the ESD protection circuit 10 is zero Amps, as Phase III in FIG. 3 shows. In this manner, node B is isolated from node A, and the voltage Va at node A remains as the input voltage and is immune to the noise showing up at node B. Consequently, the input voltage can be provided to the integrated circuit in a normal way.

In phase IV as shown in FIG. 3, when an ESD event occurs at node B, causing the voltage difference (Vb−Va) to exceed the breakdown voltage BVdss of the source-body junction, that is, when the difference between the voltages respectively applied to the source S and the body BK is higher than the breakdown voltage BVdss of the source-body junction, the source-body junction goes into avalanche breakdown. At this point, the source current increases dramatically and the generated holes drift towards the body BK, resulting in an increase of the base voltage of the parasitic bipolar transistor which, in turn, makes the base-drain junction of the parasitic bipolar transistor more forward biased. As the base-drain voltage reaches about the on-threshold voltage of the drain-body junction, e.g., 0.7V, the base-drain junction is turned on, and so is the parasitic bipolar transistor accordingly. As can be observed from the point of view of the ESD discharging circuit 10, the current IDIS flows therethrough. As the bipolar action generates more current, the source voltage reduces to a lower voltage level to maintain the source current and the snapback behavior is observed, as shown by phase IV of FIG. 3. With the parasitic bipolar transistor turned on, any increase in the voltage Vb at node B increases the current flowing through the discharging transistor NM1, which helps to prevent the increase in the voltage Vb and thus the increase in the voltage Va. In this manner, the ESD protection circuit 10 is capable of absorbing the Vb>Va energy coupled to node B through the snapback behavior of the discharging transistor NM1, thus protecting the integrated circuit from ESD damage.

As analyzed above, due to the symmetrical structure of the discharging transistor NM1, by coupling the body BK of the discharging transistor NM1 to the smaller one of the voltages Va and Vb, the ESD protection circuit 10 operates in a bi-directional manner as shown in FIG. 3, in response to the voltage Va at node A and the voltage Vb at node B. And upon such bi-directional operation, the ESD protection circuit provided by the present invention not only provides the ESD protection to the integrated circuit as the conventional ESD protection circuit does, but also rejects noises coupled to node B which is a common issue, especially for high-current, fast switching applications, so that the integrated circuit is immune to the interference of the noise.

It should be noted that, in the above embodiments, the first terminal of the discharging transistor NM1 coupled to node A is referred to as the drain D while the second terminal of the discharging transistor NM1 coupled to node B is referred to as the source S, for the purpose of easy description. However, due to the symmetric structure of the NMOS transistor and further of the ESD protection circuit 10, the drain D and the source S may exchange roles as either the first terminal or the second terminal may serve to provide and collect charge carriers.

Figure 4:
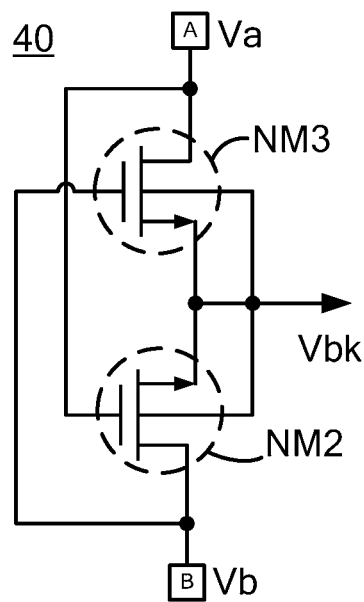
FIG. 4 schematically illustrates an exemplary body snatching circuit 40 used in the ESD protection circuit 10 of FIG. 1 in accordance with an embodiment of the present invention.

FIG. 4 schematically illustrates an exemplary body snatching circuit 40 used in the ESD protection circuit 10 of FIG. 1 in accordance with an embodiment of the present invention. The body snatching circuit 40 is illustrated to comprise the first input terminal coupled to node A, the second input terminal coupled to node B, and the output terminal configured to provide the body bias voltage Vbk.

As shown in FIG. 4, the body snatching circuit 40 is illustrated to comprise NMOS transistors NM2 and NM3. The NMOS transistor NM2 comprises a first terminal (e.g., a drain), a second terminal (e.g., a source), a third terminal (e.g., a gate) and a fourth terminal (e.g., a body), wherein the first terminal and the third terminal of the NMOS transistor NM2 are respectively coupled to the second input terminal and the first input terminal of the body snatching circuit 40. The NMOS transistor NM2 is configured to receive the voltage Vb at the first terminal and to receive the voltage Va at the third terminal. The NMOS transistor NM3 comprises a first terminal (e.g., a drain), a second terminal (e.g., a source), a third terminal (e.g., a gate) and a fourth terminal (e.g., a body), wherein the first terminal and the third terminal of the NMOS transistor NM3 are respectively coupled to the first input terminal and the second input terminal of the body snatching circuit 40. The NMOS transistor NM3 is configured to receive the voltage Va and the voltage Vb respectively at the first terminal and at the third terminal. The second terminals of the NMOS transistor NM2 and of the NMOS transistor NM3, as well as the fourth terminals of the NMOS transistor NM2 and of the NMOS transistor NM3 are all coupled together and configured as the output terminal of the body snatching circuit 40 to provide the body bias voltage Vbk.

It should be noted that the MOSFETs NM2 and NM3 are for illustrative purpose and should not be taken in a limited sense, in another embodiment, the MOSFETs NM2 and NM3 may be replaced by other suitable components, such as BJT, IGBT or the like. And in further another embodiment, the N-type MOSFETs may be replaced by P-type MOSFETs.

When the voltage Vb is higher than the voltage Va, e.g., Vb=10V, Va=5V, the NMOS transistor NM3 is turned on as the gate-source voltage is higher than the on-threshold voltage of the NMOS transistor NM3 and the NMOS transistor NM2 is turned off as the gate-source voltage is lower than the on-threshold voltage of the NMOS transistor NM2. As a result, the voltage Va is provided as the body bias voltage Vbk. In other words, the body bias voltage Vbk is substantially equal to the voltage Va. On the contrary, when the voltage Vb is smaller than the voltage Va, e.g., Vb=0V, Va=5V, the NMOS transistor NM2 is turned on as the gate-source voltage is higher than the on-threshold voltage of the NMOS transistor NM2 and the NMOS transistor NM3 is turned off as the gate-source voltage is lower than the on-threshold voltage of the NMOS transistor NM3. As a result, the body bias voltage Vbk is substantially equal to the voltage Vb. As can be seen from the above analysis, the body snatching circuit 40 outputs either the voltage Vb or the voltage Va based on which of these two signals has a lower voltage value.

Figure 5:
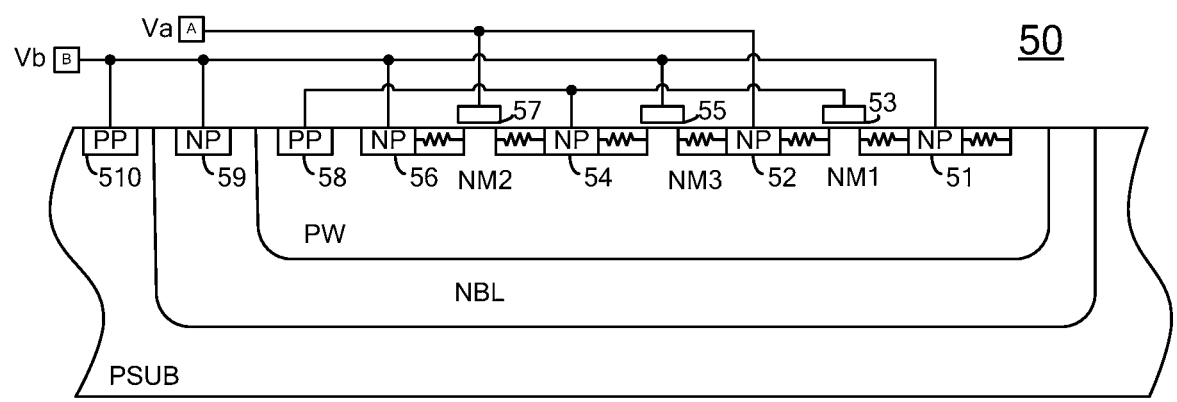
FIG. 5 illustrates a semiconductor structure 50 implementing the ESD protection circuit 10 of FIG. 1 comprising the body snatching circuit 40 of FIG. 4 in accordance with an embodiment of the present invention.

FIG. 5 illustrates a semiconductor structure 50 implementing the ESD protection circuit 10 of FIG. 1 comprising the body snatching circuit 40 of FIG. 4 in accordance with an embodiment of the present invention. As shown in FIG. 5, the semiconductor structure 50 comprises a P-type well PW (may be referred to as a semiconductor layer in the present invention) having a top surface and serving as the bodies of the discharging transistor NM1 and NMOS transistors NM2 and NM3. Inside the P well PW is formed a first highly-doped N-type well 51 serving as the source S of the discharging transistor NM1, as well as a second highly-doped N-type well 52 serving as the drains of the discharging transistor NM1 and of the NMOS transistor NM3 of the body snatching circuit 40. Additionally formed inside the P well PW is a third highly-doped N-type well 54 serving as the sources of the NMOS transistors NM2 and NM3 of the body snatching circuit 40, and a fourth highly-doped N-type well 56 serving as the drain of the NMOS transistor NM2 of the body snatching circuit 40. The N wells 51, 52, 54 and 56 adjoin the top surface of the P well PW and are isolated from each other by the P well PW. Gates 53, 55 and 57 are insulatively formed above the P well PW. The gate 53 overlaps laterally with a portion of both the first and second N wells 51 and 52 and serves as the gate of the discharging transistor NM1. The gate 55 overlaps laterally with a portion of both the second and third N wells 52 and 54 and serves as the gate of the NMOS transistor NM3. The gate 57 overlaps laterally with a portion of both the third and fourth N wells 54 and 56 and serves as the gate of the NMOS transistor NM2. As an option, a highly-doped P-type well 58 may be formed inside the P well PW as a contact region for coupling the P well PW to a bias voltage.

Refer to FIG. 5, the first and fourth N wells 51 and 56, as well as the gate 55 are coupled to node B to receive the voltage Vb. The second N well 52 and the gate 57 are coupled to node A to receive the voltage Va. In addition, the third N well 54 and the gate 53 are electrically coupled to the P well PW through the contact region 58.

With continuing reference to FIG. 5, the semiconductor structure 50 further comprises a P-type substrate PSUB for fabricating the ESD protection circuit 10 and other IC devices therein. Additionally, an N-type buried layer NBL formed surrounding the P well PW is located between the P well PW and the substrate PSUB to isolate the P well PW from the substrate PSUB, which consequently helps to isolate the ESD protection circuit 10 from other IC devices. Persons of ordinary skill in the art will recognize that, in other embodiments, a deep N-type well, a SOI (Silicon-On-Insulator) structure or other isolation structure may be employed as an alternative of the N-type buried layer NBL for isolating the P well PW from the substrate PSUB.

Further refer to FIG. 5, in the illustrated embodiment, the buried layer NBL and the substrate PSUB are coupled to the voltage Vb respectively through contact regions 59 and 510 to further provide isolation between the P well PW and the substrate PSUB in case that the P well PW and the substrate PSUB are electrically connected as the parasitic bipolar transistor formed by the P well PW, the buried layer NBL and the substrate PSUB is turned on as the P well PW is floating and can be coupled to either the voltage Va or the voltage Vb. Of course, persons of ordinary skill in the art will recognize that there are a lot of other potential combinations to provide the isolation required.

Figure 6:
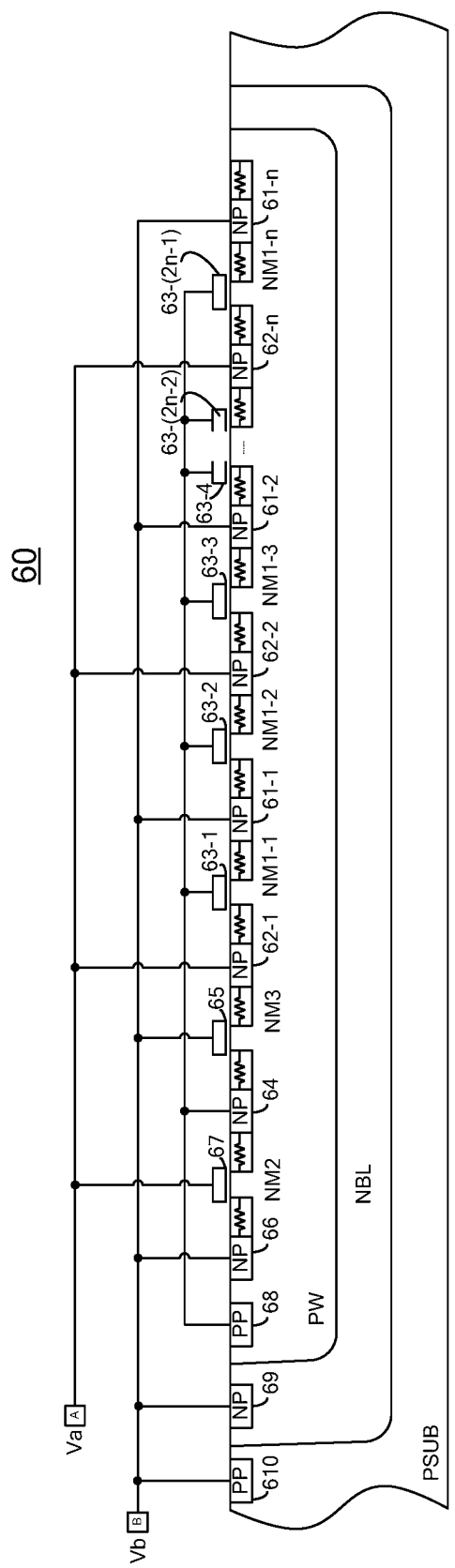
FIG. 6 illustrates another semiconductor structure 60 implementing the ESD protection circuit 10 of FIG. 1 comprising the body snatching circuit 40 of FIG. 4 with a multi-finger configuration in accordance with another embodiment of the present invention.

FIG. 6 illustrates another semiconductor structure 60 implementing the ESD protection circuit 10 of FIG. 1 comprising the body snatching circuit 40 of FIG. 4 with a multi-finger configuration in accordance with another embodiment of the present invention. The semiconductor structure 60 has a similar configuration as that of the semiconductor structure 50, thus, the same parts will not be described herein for purpose of clarity and only the different parts are emphasized. The first N-type well 51, the second N-type well 52 and the gate 53 in FIG. 5 respectively comprises a plurality of N-type sub wells 61-$n$, a plurality of N-type sub wells 62-$n$ and a plurality of sub gates 63-(2n−1), wherein n is a positive integer. The plurality of N-type sub wells 61-$n$, the plurality of N-type sub wells 62-$n$ and the plurality of sub gates 63-(2n−1) respectively serve as the source, the drain and the gate of the discharging transistor NM1 of the ESD protection circuit 10 in the embodiment of FIG. 1. As shown in FIG. 6, the plurality of N sub wells 61-$n$ and the plurality of N sub wells 62-$n$ are alternately arranged inside the P well PW, and each of the plurality of sub gates 63-(2n−1) is insulatively formed above the P well PW, overlapping laterally with a portion of a corresponding one of the first plurality of sub wells 61-$n$ and with a portion of a corresponding one of the second plurality of the sub wells 62-$n$. Refer to FIG. 6, the N sub wells 61-$n$ are coupled to node B to receive the voltage Vb, and the N sub wells 62-$n$ are coupled to node A to receive the voltage Va, and the sub gates 63-(2n−1) are electrically coupled to the P well PW. Such multi-finger structure helps to enhance the width of the discharging transistor NM1 and consequently the current-carrying capability of the discharging transistor NM1. In another embodiment, any transistor of the ESD protection circuit 10 may be implemented with the multi-finger configuration for necessity of the functionality.

Figure 7:
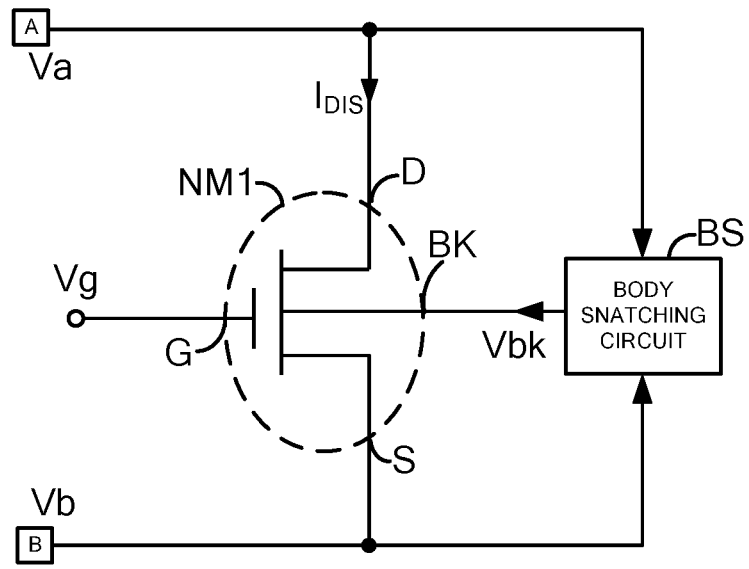
FIG. 7 illustrates an ESD protection circuit 70 in accordance with another embodiment of the present invention.

FIG. 7 illustrates an ESD protection circuit 70 in accordance with another embodiment of the present invention. Refer to FIG. 7, the ESD protection circuit 70 is configured similarly as the ESD protection circuit 10 of FIG. 1, except that the gate G of the discharging transistor NM1 of the ESD protection circuit 70 is illustratively coupled to a separate driving voltage Vg, instead of the body BK of the discharging transistor NM1. In an embodiment, the ESD protection circuit 70 is used for an output ESD protection usage where the discharging transistor NM1 also serves as an output transistor for outputting an output signal of the integrated circuit at the drain D which is coupled to an output pad, such as an open drain pad, and the driving voltage Vg is a voltage from a driving stage of the integrated circuit for driving the output transistor NM1 to output the output signal.

Still same as in FIG. 1, the body snatching circuit BS of the ESD protection circuit 70 is configured to have a first input terminal, a second input terminal and an output terminal, wherein the first input terminal is coupled to node A to receive the voltage Va, the second input terminal is coupled to node B to receive the voltage Vb, and the output terminal is coupled to the body BK of the discharging transistor NM1. The body snatching circuit BS is configured to provide a body bias voltage Vbk at the output terminal, based on the voltages Va and Vb. Specifically, the body snatching circuit BS is configured to output either the voltage Va or the voltage Vb based on which of the voltages Va and Vb has a smaller value. More specifically, the body snatching circuit BS is configured to output the lower one of the two voltages Va and Vb. In other words, the body snatching circuit BS is configured to output the voltage Va when the voltage Va is lower than the voltage Vb, and to output the voltage Vb when the voltage Vb is lower than the voltage Va. As an option, the body snatching circuit BS of the ESD protection circuit 70 may be implemented in the context of the body snatching circuit 40 as shown in FIG. 4.

Figure 8:
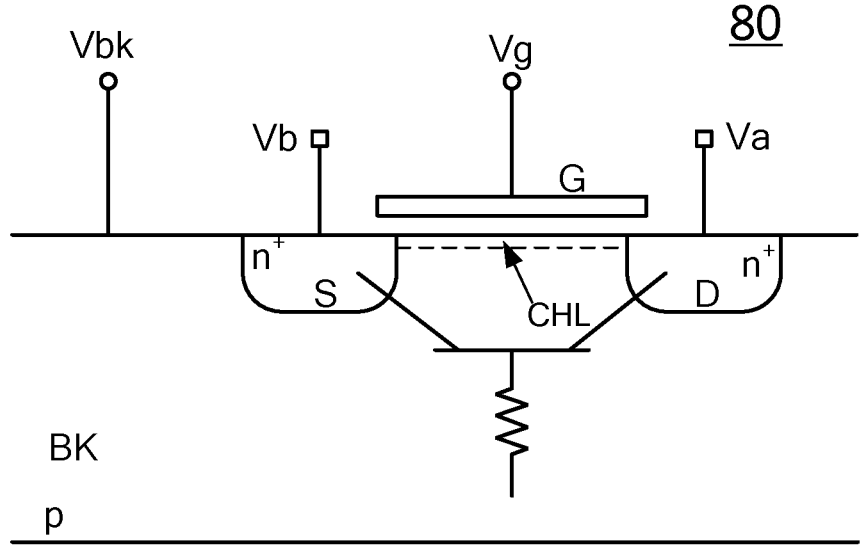
FIG. 8 illustrates a semiconductor structure 80 of the NMOS transistor NM1 of FIG. 7 for showing the operation of the ESD protection circuit 70.

FIG. 8 illustrates a semiconductor structure 80 of the NMOS transistor NM1 of FIG. 7 for showing the operation of the ESD protection circuit 70. As shown in FIG. 8, the semiconductor structure 80 has a similar configuration as that of the semiconductor structure 20 of FIG. 2, except that the gate of the semiconductor structure 80 is illustratively coupled to the separate driving voltage Vg instead of the body BK of the semiconductor structure 80.

The overall operation of the ESD protection circuit 70 will now be set forth with references to FIG. 17~FIG. 38 and FIG. 3. It should be noted that the following description is set forth assuming that node A is an output pad while node B is a ground pad, but, of course, such operation may apply to the ESD protection circuit 70 with any appropriate type of pads.

During normal operation, the discharging transistor NM1 is tuned on and off alternately so as to output an output voltage at the drain D, i.e., to provide the voltage Va at node A. More specifically, when the driving voltage Vg is higher than the turn-on threshold Vth of the discharging transistor NM1, a conduction channel CHL under the gate G as shown in FIG. 8 is established and the discharging transistor NM1 is turned on. Thus, the output voltage Va is substantially equal to, but actually a bit higher than the ground potential (e.g., 0V). Under such a condition, the body snatching circuit BS provides the voltage Vb at node B, that is, the ground potential, as the body bias voltage Vbk, which in turn sets the difference between the voltages respectively applied to the drain D and the body BK higher than zero volts but lower than the breakdown voltage BVdss of the drain-body junction. That is, 0<(Va−Vb)<BVdss. Thus, the drain-body junction is reversely biased and is in an off state, and so thus is the parasitic bipolar transistor inside the discharging transistor NM1. While when the driving voltage Vg is lower than the turn-on threshold Vth of the discharging transistor NM1, no conduction channel is established and the discharging transistor NM1 is turned off. As a result, the output voltage Va is higher than the voltage Vb at node B. In an embodiment, the output voltage Va is equal to or a bit lower than a 5V supply voltage provided to node A through an open drain resistor. Under such a condition, the body snatching circuit BS provides the voltage Vb, that is, the ground potential, as the body bias voltage Vbk, which in turn sets the difference between the voltages respectively applied to the drain D and the body BK higher than zero volts but lower than the breakdown voltage BVdss of the drain-body junction. That is, 0<(Va−Vb)<BVdss. Thus, the drain-body junction is reversely biased and is in an off state, and so thus is the parasitic bipolar transistor inside the discharging transistor NM1. As can be seen from the above analysis, during normal operation, the parasitic bipolar transistor inside the discharging transistor NM1 is off and no current is conducted through the parasitic bipolar transistor, and the transistor NM1 operates normally as an output transistor of the integrated circuit to output the output voltage by turning the conduction channel CHL on and off alternately.

During an ESD event, the driving voltage Vg is usually lower than the turn-on threshold Vth although it is indeterminate. Typically, the gate G of the discharging transistor NM1 is coupled, either capacitively or actively, close to the source of the discharging transistor NM1 (the ground potential). During an ESD event where the voltage Va at node A goes up rapidly to a high positive value, e.g., 12 volts for 5V operation NMOS, while the voltage Vb at node B remains at the 0V ground reference voltage, no conduction channel is established and the output transistor NM1 is turned off as the driving voltage Vg is lower than the turn-on threshold Vth of the discharging transistor NM1. On the other hand, the body snatching circuit BS outputs the voltage Vb to the body BK of the discharging transistor NM1, which in turn sets the difference (12 volts) between the voltages respectively applied to the drain D and the body BK higher than the 10V breakdown voltage BVdss of the drain-body junction (BVdss<(Va−Vb)). Thus, the drain-body junction goes into a first breakdown and a second breakdown sequentially, which is observed as a snapback behavior as phase II of FIG. 3 shows. At this point, current flows from the drain D to the body BK, resulting an increase of the base voltage of the parasitic bipolar transistor and a subsequent body-source current by turning on the body-source junction. As phase II in FIG. 3 shows, the current IDIS flows from node A to node B through the parasitic bipolar transistor inside the discharging transistor NM1, to discharge the ESD energy. As a result, ESD protection is provided to protect the integrated circuit from damage.

In phase IV as shown in FIG. 3, during an ESD event where the voltage Va at node A goes down rapidly to a low negative value, e.g., −12 volts for 5V operation NMOS, while the voltage Vb at node B remains at the 0V ground reference voltage, the body snatching circuit BS outputs the voltage Va to the body BK of the discharging transistor NM1, and the voltage difference (Vb−Va) exceeds the breakdown voltage BVdss of the source-body junction, the source-body junction accordingly goes into avalanche breakdown. At this point, the source current increases dramatically and the generated holes drift towards the body BK, resulting in an increase of the base voltage of the parasitic bipolar transistor which, in turn, makes the base-drain junction of the parasitic bipolar transistor more forward biased. As the base-drain voltage reaches about the on-threshold voltage of the drain-body junction, e.g., 0.7V, the base-drain junction is turned on, and so is the parasitic bipolar transistor accordingly. As can be observed from the point of view of the ESD discharging circuit 70, the current IDIS flows therethrough. As the bipolar action generates more current, the source voltage reduces to a lower voltage level to maintain the source current and the snapback behavior is observed, as shown by phase IV of FIG. 3. With the parasitic bipolar transistor turned on, any increase in the voltage Vb at node B increases the current flowing through the discharging transistor NM1, which helps to prevent the increase in the voltage Vb and thus the increase in the voltage Va. In this manner, the ESD protection circuit 70 is capable of absorbing the Vb>Va energy coupled to node B through the snapback behavior of the discharging transistor NM1, thus protecting the integrated circuit from ESD damage. On the other hand, during the ESD event where Va=−12V and Vb=0V, the conduction channel CHL under the gate G is turned on as the difference between the gate voltage Vg and the voltage Va applied on the drain D of the discharging transistor NM1 is higher than the turn-on threshold Vth of the discharging transistor NM1, this conduction channel CHL provides an additional current path for releasing the energy from node B to node A, however, as the releasing current level of this conduction channel CHL is relatively small in comparison with the current releasing level provided by the parasitic bipolar transistor, the effect of this conduction channel CHL may be ignored for the purpose of ESD protection, and if anything provides a beneficial parallel conduction path to discharge the ESD energy.

When a noise, for example, with a voltage value above 10 volts for 5V operation NMOS with 10V BVdss, is coupled to node B, causing the voltage Vb at node B higher than the voltage Va at node A, the body snatching circuit BS outputs the voltage Va as the body bias voltage Vbk which is provided to the body BK of the NMOS transistor NM1. Thus, on one hand, upon the voltage Vb applied to the source S being higher than the voltage Va applied to the body BK, the source-body junction is reversely biased. And on the other hand, the drain-body junction is not biased as both the drain D and the body BK are applied with the same voltage Va. In addition, as the driving voltage Vg is smaller than the voltage Vb, no conduction channel is established and the discharging transistor NM1 is tuned off.

In phase III as shown in FIG. 3, when the voltage difference (Vb−Va) is lower than the breakdown voltage BVdss of the source-body junction, the source-body junction is in an off state. Consequently, no current flows through the parasitic bipolar transistor of the discharging transistor NM1. That is, the current IDIS flowing through the ESD protection circuit 10 is zero Amps, as Phase III in FIG. 3 shows. In this manner, node B is isolated from node A, and the voltage Va at node A remains as the input voltage and is immune to the noise showing up at node B. Consequently, the input voltage can be provided to the integrated circuit in a normal way.

In addition, during a latch-up real application stress condition or quality assurance testing, where the voltage Va is set below ground with its absolute value higher than the breakdown voltage BVdss of the drain-body junction, e.g., −8V, the body snatching circuit BS outputs the voltage Va to the body BK of the discharging transistor NM1, which in turn sets the difference between the voltages respectively applied to the source S and the body BK higher than zero volts but lower than the breakdown voltage BVdss of the source-body junction. That is, 0<(Va−Vb)<BVdss. Thus, the source-body junction is reversely biased and is in an off state, and so thus is the parasitic bipolar transistor inside the discharging transistor NM1, which helps to avoid a latch-up event. In comparison, for a conventional ESD circuit where the body of the discharging transistor is coupled to its source, the body voltage is equal to the 0V source voltage, which results the conduction of the forward biased diode formed between the body and drain of the discharging transistor which can trigger a latch-up. It should be noted, under such a condition, the conduction channel CHL under the gate G is turned on as the difference between the gate voltage Vg and the voltage Va applied on the drain D of the discharging transistor NM1 is higher than the turn-on threshold Vth of the discharging transistor NM1, this conduction channel CHL provides an additional current path for releasing the energy from node B to node A, however, as the releasing current level of this conduction channel CHL is relatively small in comparison with the current releasing level provided by the parasitic bipolar transistor, the effect of this conduction channel CHL may be ignored, and since it is surface majority carrier current it is in any case incapable of triggering a latch-up.

As analyzed above, due to the symmetrical structure of the discharging transistor NM1, by coupling the body BK of the discharging transistor NM1 to the smaller one of the voltages Va and Vb, the ESD protection circuit 70 operates in a bi-directional manner as shown in FIG. 3, in response to the voltage Va at node A and the voltage Vb at node B. And upon such bi-directional operation, the ESD protection circuit 70 provided by the present invention not only provides the ESD protection to the integrated circuit as the conventional ESD protection circuit does, but also rejects noises coupled to node B which is a common issue, especially for high-current, fast switching applications, so that the integrated circuit is immune to the interference of the noise. In addition, a latch-up event due to the forward-biased conduction of the diode inside the discharging transistor of the convention ESD protection circuit can be effectively avoided.

Figure 9:
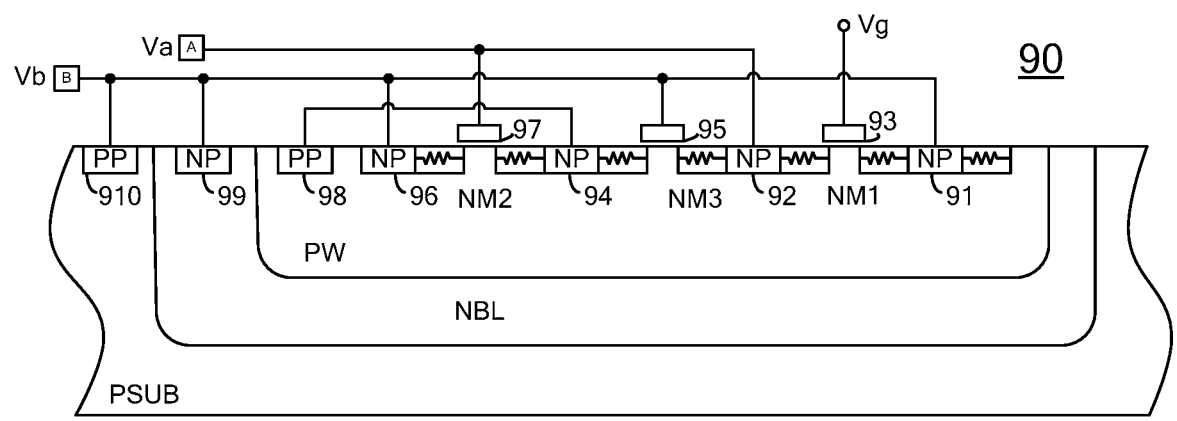
FIG. 9 illustrates a semiconductor structure 90 implementing the ESD protection circuit 70 of FIG. 7 comprising the body snatching circuit 40 of FIG. 4 in accordance with an embodiment of the present invention.

FIG. 9 illustrates a semiconductor structure 90 implementing the ESD protection circuit 70 of FIG. 17 comprising the body snatching circuit 40 of FIG. 4 in accordance with an embodiment of the present invention. As shown in FIG. 9, the semiconductor structure 90 comprises a P-type well PW (may be referred to as a semiconductor layer in the present invention) having a top surface and serving as the bodies of the discharging transistor NM1 and NMOS transistors NM2 and NM3. Inside the P well PW is formed a first highly-doped N-type well 91 serving as the source S of the discharging transistor NM1, as well as a second highly-doped N-type well 92 serving as the drains of the discharging transistor NM1 and of the NMOS transistor NM3 of the body snatching circuit 40. Additionally formed inside the P well PW is a third highly-doped N-type well 94 serving as the sources of the NMOS transistors NM2 and NM3 of the body snatching circuit 40, and a fourth highly-doped N-type well 96 serving as the drain of the NMOS transistor NM2 of the body snatching circuit 40. The N wells 91, 92, 94 and 96 adjoin the top surface of the P well PW and are isolated from each other by the P well PW. Gates 93, 95 and 97 are insulatively formed above the P well PW. The gate 93 overlaps laterally with a portion of both the first and second N wells 91 and 92 and serves as the gate of the discharging transistor NM1. The gate 95 overlaps laterally with a portion of both the second and third N wells 92 and 94 and serves as the gate of the NMOS transistor NM3. The gate 97 overlaps laterally with a portion of both the third and fourth N wells 94 and 96 and serves as the gate of the NMOS transistor NM2. As an option, a highly-doped P-type well 98 may be formed inside the P well PW as a contact region for coupling the P well PW to a bias voltage.

Refer to FIG. 9, the first and fourth N wells 91 and 96, as well as the gate 95 are coupled to node B to receive the voltage Vb. The second N well 92 and the gate 97 are coupled to node A to receive the voltage Va. In addition, the third N well 94 is electrically coupled to the P well PW through the contact region 98 and the gate 93 is electrically coupled to the driving voltage Vg.

With continuing reference to FIG. 9, the semiconductor structure 90 further comprises a P-type substrate PSUB for fabricating the ESD protection circuit 70 and other IC devices therein. Additionally, an N-type buried layer NBL formed surrounding the P well PW is located between the P well PW and the substrate PSUB to isolate the P well PW from the substrate PSUB, which consequently helps to isolate the ESD protection circuit 70 from other IC devices. Persons of ordinary skill in the art will recognize that, in other embodiments, a deep N-type well, a SOI (Silicon-On-Insulator) structure or other isolation structure may be employed as an alternative of the N-type buried layer NBL for isolating the P well PW from the substrate PSUB.

Further refer to FIG. 9, in the illustrated embodiment, the buried layer NBL and the substrate PSUB are coupled to the voltage Vb respectively through contact regions 99 and 910 to further provide isolation between the P well PW and the substrate PSUB in case that the P well PW and the substrate PSUB are electrically connected as the parasitic bipolar transistor formed by the P well PW, the buried layer NBL and the substrate PSUB is turned on as the P well PW is floating and can be coupled to either the voltage Va or the voltage Vb. Of course, persons of ordinary skill in the art will recognize that there are a lot of other potential combinations to provide the isolation required.

Figure 10:
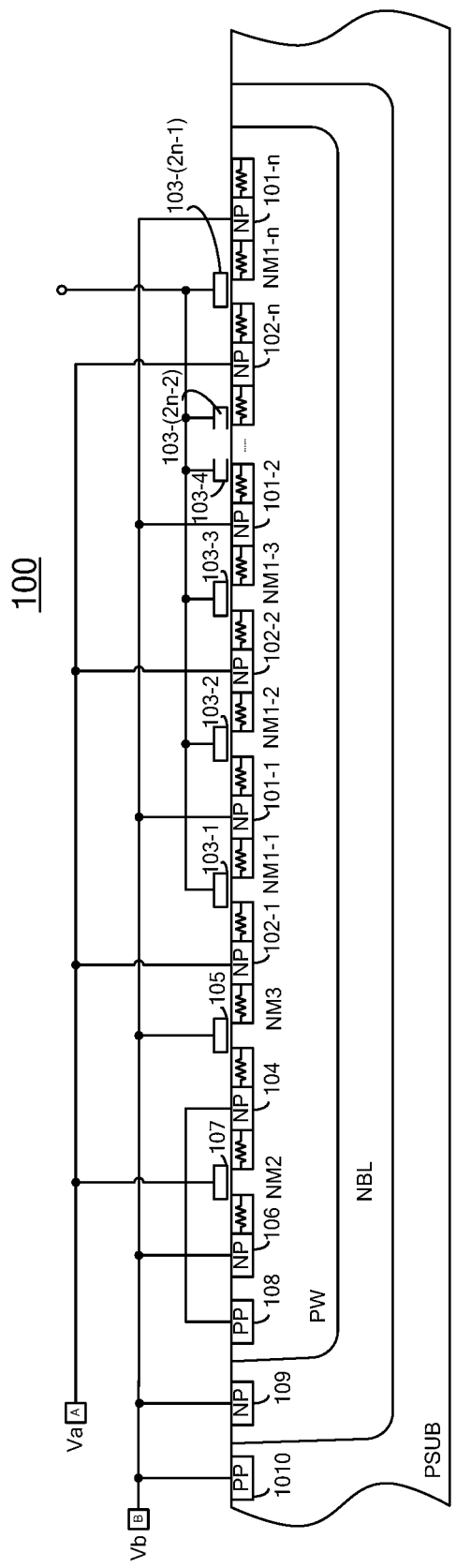
FIG. 10 illustrates another semiconductor structure 100 implementing the ESD protection circuit 70 of FIG. 7 comprising the body snatching circuit 40 of FIG. 4 with a multi-finger configuration in accordance with another embodiment of the present invention.

FIG. 10 illustrates another semiconductor structure 100 implementing the ESD protection circuit 70 of FIG. 7 comprising the body snatching circuit 40 of FIG. 4 with a multi-finger configuration in accordance with another embodiment of the present invention. The semiconductor structure 100 has a similar configuration as that of the semiconductor structure 90, thus, the same parts will not be described herein for purpose of clarity and only the different parts are emphasized. The first N-type well 91, the second N-type well 92 and the gate 93 in FIG. 9 respectively comprises a plurality of N-type sub wells 101-$n$, a plurality of N-type sub wells 102-$n$ and a plurality of sub gates 103-(2n−1), wherein n is a positive integer. The plurality of N-type sub wells 101-$n$, the plurality of N-type sub wells 102-$n$ and the plurality of sub gates 103-(2n−1) respectively serve as the source, the drain and the gate of the discharging transistor NM1 of the ESD protection circuit 70 in the embodiment of FIG. 7. As shown in FIG. 10, the plurality of N sub wells 101-$n$ and the plurality of N sub wells 102-$n$ are alternately arranged inside the P well PW, and each of the plurality of sub gates 103-(2n−1) is insulatively formed above the P well PW, overlapping laterally with a portion of a corresponding one of the first plurality of sub wells 101-$n$ and with a portion of a corresponding one of the second plurality of the sub wells 102-$n$. Refer to FIG. 10, the N sub wells 101-$n$ are coupled to node B to receive the voltage Vb, and the N sub wells 102-$n$ are coupled to node A to receive the voltage Va, and the sub gates 103-(2n−1) are electrically coupled to the driving voltage Vg. Such multi-finger structure helps to enhance the width of the discharging transistor NM1 and consequently the current-carrying capability of the discharging transistor NM1. In another embodiment, any transistor of the ESD protection circuit 10 may be implemented with the multi-finger configuration for necessity of the functionality.

It will be appreciated by persons skilled in the art that the present invention is not limited to what has been particularly shown and described herein above. Rather the scope of the present invention is defined by the claims and includes both combinations and sub-combinations of the various features described hereinabove as well as variations and modifications thereof which would occur to persons skilled in the art upon reading the foregoing description and which are not in the prior art.

What is claimed is:

1. An ESD protection circuit coupled between a first node and a second node for protecting an integrated circuit from ESD damage, wherein at the first node exits a first voltage, and at the second node exits a second voltage, the ESD protection circuit comprising:
   a discharging transistor having a drain, a gate, a source and a body, wherein the drain is coupled to the first node, the source is coupled to the second node, the gate is coupled to a driving voltage; and
   a body snatching circuit having a first input terminal, a second input terminal and an output terminal, wherein the first input terminal is coupled to the first node, the second input terminal is coupled to the second node, and the output terminal is coupled to the body, and wherein the body snatching circuit is configured to output a lower one of the first voltage and the second voltage at the output terminal.

2. The ESD protection circuit of claim 1, wherein the discharging transistor comprises a Metal-Oxide-Semiconductor transistor.

3. The ESD protection circuit of claim 1, wherein the discharging transistor comprises an N-type transistor.

4. The ESD protection circuit of claim 1, wherein the discharging transistor is configured to output an output signal of the integrated circuit at the drain.

5. The ESD protection circuit of claim 4, wherein the driving voltage is provided by a driving stage of the integrated circuit, and wherein the driving stage is configured to drive the discharging transistor to output the output signal.

6. The ESD protection circuit of claim 1, wherein the first node is an output pad and the second node is a ground pad.

7. The ESD protection circuit of claim 1, wherein the body snatching circuit comprises:
   a first transistor having a drain, a source, a gate and a body, wherein the drain of the first transistor is coupled to the first node, the gate of the first transistor is coupled to the second node, and the source of the first transistor and the body of the first transistor are coupled to the body of the discharging transistor; and a second transistor having a drain, a source, a gate and a body, wherein the drain of the second transistor is coupled to the second node, the gate of the second transistor is coupled to the first node, and the source of the second transistor and the body of the second transistor are coupled to the body of the discharging transistor.

8. The ESD protection circuit of claim 7, wherein the first transistor and the second transistor respectively comprise an NMOS.

9. A circuitry, comprising:
an ESD protection circuit coupled between a first node and a second node, wherein at the first node exits a first voltage, and at the second node exits a second voltage, and wherein the ESD protection circuit comprises:
a discharging transistor having a drain, a gate, a source and a body, wherein the drain is coupled to the first node, the source is coupled to the second node, the gate is coupled to a driving voltage; and
a body snatching circuit having a first input terminal, a second input terminal and an output terminal, wherein the first input terminal is coupled to the first node, the second input terminal is coupled to the second node, and the output terminal is coupled to the body, and wherein the body snatching circuit is configured to output a lower one of the first voltage and the second voltage at the output terminal; and
an integrated circuit coupled between the first node and the second node.

10. The circuitry of claim 9, wherein the discharging transistor comprises a Metal-Oxide-Semiconductor transistor.

11. The circuitry of claim 9, wherein the discharging transistor comprises an N-type transistor.

12. The circuitry of claim 9, wherein the discharging transistor is configured to output an output signal of the integrated circuit at the drain.

13. The circuitry of claim 12, wherein the driving voltage is provided by a driving stage of the integrated circuit, and wherein the driving stage is configured to drive the discharging transistor to output the output signal.

14. The circuitry of claim 9, wherein the first node is an output pad and the second node is a ground pad.

15. The circuitry of claim 9, wherein the body snatching circuit comprises:
a first transistor having a drain, a source, a gate and a body, wherein the drain of the first transistor is coupled to the first node, the gate of the first transistor is coupled to the second node, and the source of the first transistor and the body of the first transistor are coupled to the body of the discharging transistor; and
a second transistor having a drain, a source, a gate and a body, wherein the drain of the second transistor is coupled to the second node, the gate of the second transistor is coupled to the first node, and the source of the second transistor and the body of the second transistor are coupled to the body of the discharging transistor.

16. The circuitry of claim 15, wherein the first transistor and the second transistor respectively comprise an NMOS.

* * * * *